United States Patent [19]

Simson et al.

[11] Patent Number: 4,854,266
[45] Date of Patent: Aug. 8, 1989

[54] CROSS-FLOW DIFFUSION FURNACE

[75] Inventors: Morris Simson, Framingham; John H. Fabricius, Westford, both of Mass.; Ronnie Browne, Derry, N.H.; Arthur Waugh, Winchester, Mass.; Robert F. Sarkozy, Westford, Mass.; Chiu K. S. Lai, Wellesley, Mass.

[73] Assignee: BTU Engineering Corporation, North Billerica, Mass.

[21] Appl. No.: 115,884

[22] Filed: Nov. 2, 1987

[51] Int. Cl.[4] .................. C23C 16/44; B05C 13/02
[52] U.S. Cl. ................................. 118/728; 118/500
[58] Field of Search ............. 118/728, 732, 733, 500

[56] References Cited

U.S. PATENT DOCUMENTS

| 3,297,501 | 1/1967 | Reisman | 148/175 |
| 3,675,619 | 7/1972 | Burd | 118/719 |
| 4,131,659 | 12/1978 | Authier et al. | 264/25 |
| 4,182,749 | 1/1980 | Green et al. | 118/719 |
| 4,309,240 | 1/1982 | Zaferes | 118/500 X |
| 4,365,587 | 12/1982 | Hirose et al. | 118/719 |
| 4,525,382 | 6/1985 | Sugioku | 118/719 |
| 4,545,327 | 10/1985 | Campbell et al. | 118/719 |
| 4,547,404 | 10/1985 | Campbell et al. | 427/248.1 |
| 4,573,431 | 3/1986 | Sarkozy | 118/733 X |
| 4,778,561 | 10/1988 | Ghanbari | 427/38 |

FOREIGN PATENT DOCUMENTS

| 2397876 | 3/1979 | France | |
| 247933 | 12/1985 | Japan | 118/719 |
| 263997 | 7/1986 | Japan | 118/732 |

Primary Examiner—Evan Lawrence
Attorney, Agent, or Firm—Weingarten, Schurgin, Gagnebin & Hayes

[57] ABSTRACT

A longitudinally extending cross-flow liner within a longitudinally extending cylindrical reaction vessel cooperates with at least one longitudinally extending gas injector within the cross-flow liner to provide transversely flowing gas across the surfaces of vertically oriented semiconductor wafers in such a way as to substantially eliminate both depletion phenomenon and downstream wafer pollution caused from particulates, unreacted reactant gas, and other contaminants and to provide uniformly coated wafers in a batch and repeatability batch to batch.

7 Claims, 4 Drawing Sheets

CROSS-FLOW DIFFUSION FURNACE

FIELD OF THE INVENTION

The present invention is directed to the field of semiconductor wafer processing, and more particularly, to a novel cross-flow diffusion furnace for semiconductor wafers.

BACKGROUND OF THE INVENTION

The semiconductor processing industry makes use of diffusion furnaces to deposit various coatings on the surfaces of wafers. The coatings are produced from gases introduced into the reaction vessels of the diffusion furnaces. The gases pyrolytically decompose, are surface catalyzed by the wafers, and deposit as thin films. For any of the known CVD and other processes, the quality, uniformity, yield, and repeatability of the deposited thin films critically depend on the temperature, quantity, purity, flow rate, flow pattern and distribution of the gases.

Some heretofore known diffusion furnaces have one or more vertically stacked generally cylindrical and horizontally extending furnace tubes as shown, for example, in commonly assigned issued United States utility patent application Ser. No. 836,294, incorporated herein by reference. Wafers are loaded in "boats", usually fabricated of quartz or other refractory material, designed to hold a plurality of wafers. Multiple boats are placed on boat-loading mechanisms operative to automatically insert and remove the boat loaded wafers into and out the furnace tubes. Reactant gases are usually introduced at one end of the furnace tubes and are introduced through longitudinally extending gas injection tubes as shown, for example, in commonly assigned U.S. Pat. No. 4,573,431, incorporated herein by reference. The gases flow longitudinally past multiple downstream wafers before being exhausted to a vacuum port coupled to the other end of the process tubes. The downstream wafers of each furnace load of wafers are thereby exposed to excess unreacted reactants, reaction by-products, gas particulate impurities and other contaminants, and different gas quantities and flow rates.

Other heretofore known semiconductor wafer processing furnaces have substantially a two-part, removable cover and base defining a Bell-jar like reaction vessel as disclosed, for example, in U.S. Pat. Nos. 4,545,327 and 4,547,404, each incorporated herein by reference. Heating elements are carefully positioned along inside walls surrounding and spaced from the covers of the Bell-jar like reaction vessels. In the interspace between the inside walls and covers, a positive pressure is established to prevent injectant gases from flowing backwards from the Bell-jar like reaction vessels towards, and contaminating, the heating coils and the inside walls of the semiconductor wafer processing furnaces.

An upstanding pedestal and a spaced apart linearly-extending vacuum port are provided inside the Bell-jar like reaction vessels. The pedestals include a gas showerhead spaced from and confronting the vacuum ports inside the reaction vessels. Gases are released from the showerheads and are attracted by the vacuum ports. The gases flow into the vacuum ports past and parallel to the surfaces of wafers placed on the base. The gas flow patterns that exist between the showerheads and the confronting vacuum ports are, however, such that different quantities of gases and flow rates deposit as different thickness thin films in dependence on the particular location of the wafers producing undesirable coating non-uniformities wafer to wafer and batch to batch.

Another disadvantage is that the processing throughput of the Bell-jar like reaction vessels is restricted. Access to the reaction vessels involves lifting the covers off of the bases, and reseating them, after having manually lowered or lifted the boats onto and off of the bases. The lifting, boat placement and removal, and cover seating operations are both time and labor intensive and to that extent limit the processing throughput.

In addition to a slower than desirable processing throughput, the Bell-jar like reaction vessels have a quite limited capacity. For each production run, only a few boats of wafers are capable of being processed within their limited interior space. To achieve a high yield, production runs must be either repeatedly made or more machines must be kept in continuous operation. Both avenues require that considerable acquisition, production, and maintenance costs be incurred.

Particulates are a problem for both the longitudinal and the Bell-jar like diffusion furnaces. The sizes of structures being fabricated are being decreased so as to get more and more devices onto less wafer area to improve circuit density and circuit performance. The sizes of some particulates are commensurate with the sizes of some of the high-speed microstructures being fabricated. As the probability of damage increases with the number of devices on a chip, once innocuous particles can spoil whole batches of high circuit density high performance wafers. In the heretofore known horizontally extending semiconductor processing furnaces, the gases flow from upstream wafers past downstream wafers to the vacuum port. The downstream wafers are thereby exposed to entrained particulates, and therewith to possible degradation. In the heretofore known Bell-jar like reaction vessels, the upper gas showerheads and confronting vacuum ports therebelow expose the wafers on the base to a potentially damaging rain of particulates as the gases, and the entrained particles and other contaminates, flow past the wafers.

SUMMARY OF THE INVENTION

The present invention contemplates as its principal object one or more horizontally extending generally cylindrical reaction vessels having ends, one or more vacuum ports coupled to corresponding ones of the ends of the one or more horizontally extending reaction vessels for creating and maintaining a first negative pressure in the one or more reaction vessels that acts in the direction of elongation of the reaction vessels, and further contemplates a generally cylindrical cross-flow liner mounted inside each of the one or more reaction vessels for creating in response to the first negative pressure a second negative pressure inside the cross-flow liner that acts in a direction generally transverse the direction of action of the first negative pressure. One or more longitudinally extending gas injectors are disposed within each of the reaction vessels, and inside the corresponding cross-flow liner. The second negative pressure, which is uniform along each of the reaction vessels, draws the same quantity and rate of flow of reactant gas from the one or more gas injectors across each wafer of a tube load of wafers. Each wafer sees substantially the same quantity and gas flow rate as the other wafers, thereby achieving coating uniformity wafer to wafer and batch to batch.

The cross-flow liner of the invention is retrofittable with little expense to already existing diffusion furnace equipment, such as that manufactured by the instant assignee, so that existing owners and new buyers are able to obtain a marked enhancement in performance with relatively little new equipment expense. The invention is completely compatible with industry automation and the trend towards smaller size microstructures, and machines embodying the invention are capable of providing high processing throughputs.

BRIEF DESCRIPTION OF THE DRAWINGS

These and other objects, aspects and advantages of the present invention will become apparent as the invention becomes better understood by referring to the following detailed description of a preferred embodiment thereof, and to the drawings, wherein.

DETAILED DESCRIPTION OF THE PREFERRED EMBODIMENT

Figure 1:
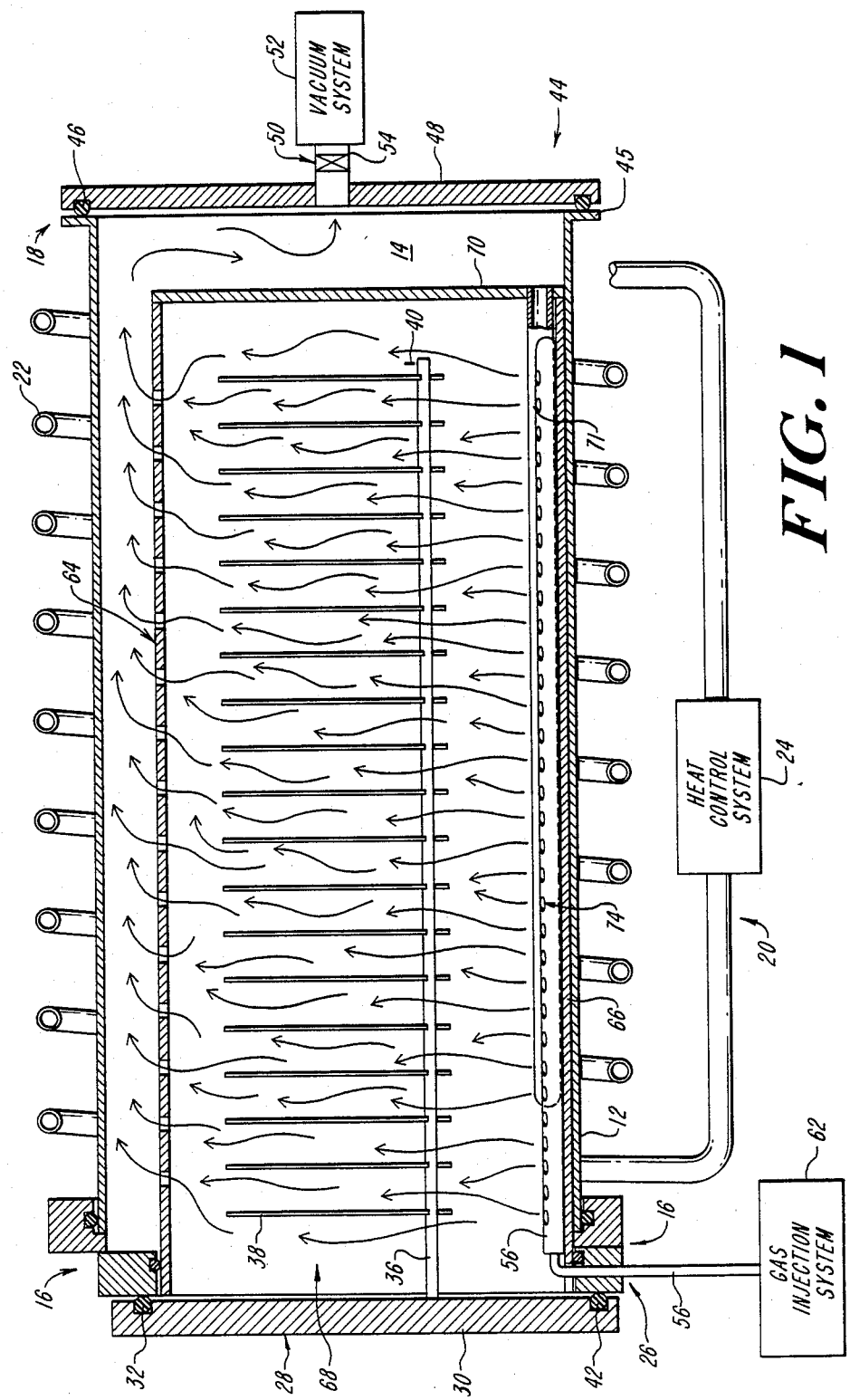
FIG. 1 is a schematic pictorial diagram illustrating a cross-flow diffusion furnace for semiconductor wafers in accordance with the present invention.
Figure 2:
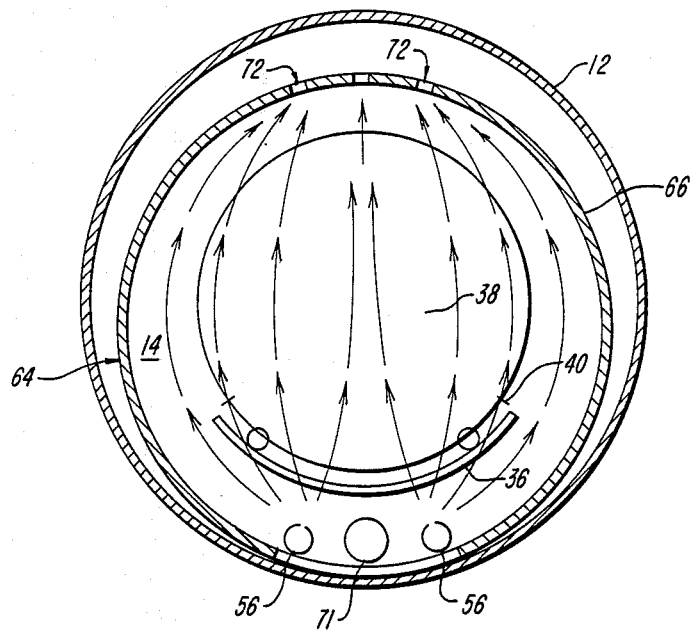
FIG. 2 is a cross-sectional pictorial diagram illustrating the cross-flow diffusion furnace according to the present invention.

Referring now to FIGS. 1 and 2, the novel cross-flow diffusion furnace according to the present invention includes a symmetrical diffusion tube 12 having open ends that defines a longitudinally extending reaction chamber generally designated 14. The tube 12 is preferrably cylindrically shaped and is fashioned from any suitable high-temperature material such as quartz. Vacuum seals generally designated 16, 18 are provided at the respective ends of the tube 12. A variety of diffusion tubes, such as those having flanged or flangeless vacuum seals, or a ball socket tube, may of course be employed without departing from the inventive concept.

A heating system generally designated 20 is coupled to the diffusion tube 12 to controllably maintain a selected temperature in the reaction chamber 14. The heating system 20 preferably includes a resistance element 22 coiled peripherally around the diffusion tube 12 that is connected to a heat control system 24 to precisely maintain a selected temperature in the chamber 14 to within a selected tolerance. Thermocouples inserted into a thermocouple sheath to be described are connected to the heat control system 24, which thermocouples monitor the temperature in the reaction vessel 14.

One or more gas injection ports generally designated 26, to be described, are provided through the circumferential wall of the seal 16 that are individually in communication with the chamber 14 for controllably injecting reactant in gas phase thereinto.

A boat loader is generally designated at 28. The loader 28 includes a plate 30 that is removably fastened in vacuum-tight sealing engagement with the seal 16 via an O-ring 32. The boat loader 28 includes extending cantilevered arm 36. Although a cantilevered arm is illustrated, it is noted that carriage-type, wheelbarrow-type, and other boat loading mechanisms can be employed as well. A plurality of semiconductor wafers 38 are supported on the arm 36 in one or more boats 40 of conventional design in longitudinally spaced apart relation, with the plane of the wafers being generally coincident with the vertical plane.

The plate 30 of the boat loader 28 is connected to a motor, not shown, that controls its X translation for inserting the arm 36 into the reaction chamber 14 and for removing the arm 36 out of the reaction chamber, and therewith the boat-loaded wafers 38.

A door generally designated 44 is removably fastened to and forms part of the seal 18. The seal 18 includes a flange 45 integrally formed about the cylindrical member 12. The door 44 is in vacuum-tight sealing engagement via an O-ring 46 with the annular flange 45. The door 44 includes a plate 48 having a central aperture therethrough generally designated 50 for connection to a controlled source of vacuum.

A vacuum unit 52 is connected to the bore 50 via a coupling 54 for establishing and controllably maintaining a first vacuum condition in the chamber 14, which first vacuum acts in the direction of elongation of the diffusion tube 12. Any suitable vacuum unit may be employed.

One or more gas injection tubes 56 are provided radially through the seal 16 in vacuum-tight sealing engagement therewith, two spaced about twenty degrees to either side of the vertical being presently preferred, which are operatively connected to a gas-injection system 62. The gas-injection system 62 is operative to controllably introduce preselected reactant in gas phase into the reaction chamber 14 selected for any one of various V-CVD and other deposition processes well-known to those skilled in the art.

Figure 3:
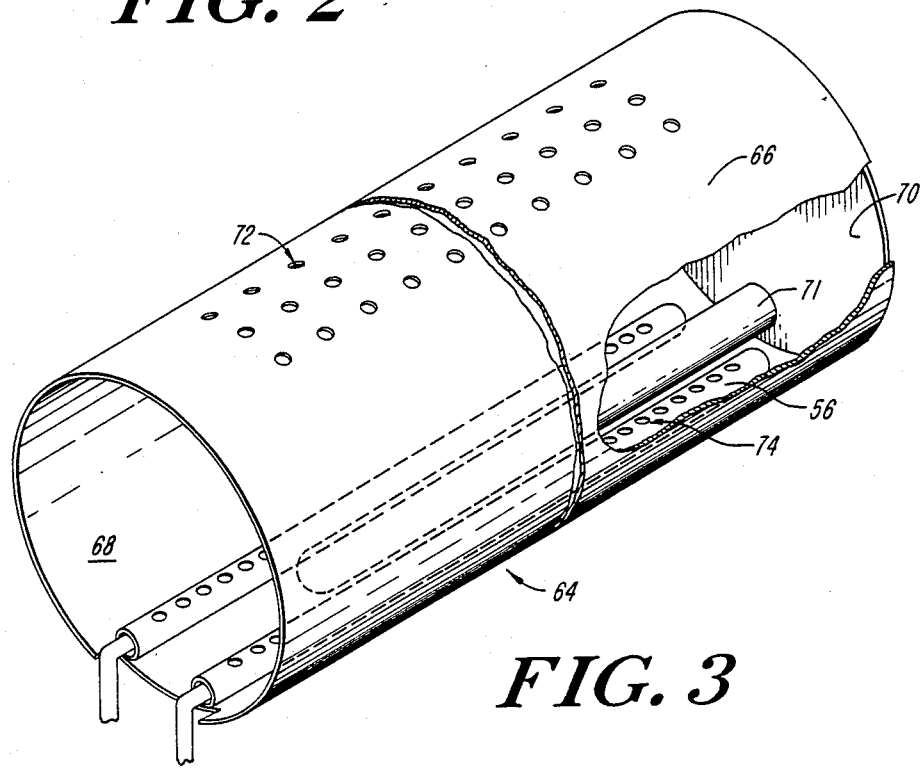
FIG. 3 is a perspective view illustrating the cross-flow liner of the cross-flow diffusion furnace in accordance with the present invention.

Referring now also to FIG. 3, a cross-flow liner generally designated 64 is slidably inserted into the diffusion tube 12 and is supported off the bottom wall thereof. The cross-flow liner 64 includes a cylinder 66 having an open end generally designated 68 and a sealed end 70. The longitudinal dimension of the cross-flow liner 64 is selected to be about sixty to seventy five percent of the longitudinal dimension of the furnace tube 12, and the diametrical dimension of the cross-flow liner 64 is selected to be about fifty to ninety five percent of the inside diametrical dimension of the diffusion tube 12 so as to provide a ten to a fifty millimeter annulus. The cross-flow liner 64 is received in the diffusion tube 12 with its sealed wall 70 confronting and spaced from the vacuum port 50 and with its open end 68 mounted in vacuum-tight relation with the tube 12 via the seal 16. The cross-flow liner 66 rests on the confronting bottom wall of the diffusion tube 12. The cross-flow liner is constructed from any suitable refractory material such as quartz.

The cantilevered paddle 36 extends in the cross-flow liner 66 at a radial point in the reaction chamber remote from the cross-flow liner bottom wall, and above the one or more gas injectors 56. The paddle 36 is provided with openings therethrough through which the gas released from the injectors passes upwardly into the region having the wafers to be coated. A quartz tube 71 closed at one end is mounted in vacuum-tight sealing relation with the wall 70 of the cross-flow liner so as to provide a vacuum-tight well into which the thermocouples connected to the heat control system 24 are inserted.

A plurality of apertures generally designated 72 of a predetermined size in a preselected Pattern are provided through the wall of the cross-flow liner remote from the wall thereof supported on the bottom of the diffusion tube. A second plurality of apertures 74 of a predetermined size and in a preselected pattern are provided along the one or more gas injectors.

Figure 4:
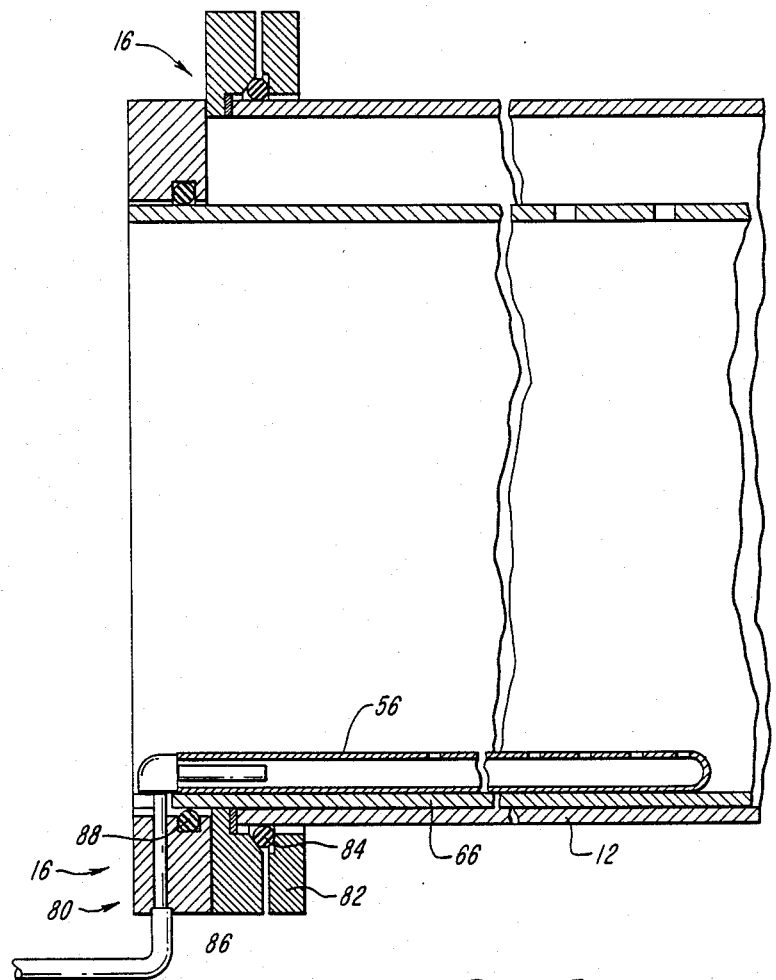
FIG. 4 is a partial longitudinal section of the Peripheral wall at the load end of the cross-flow diffusion furnace according to the present invention.

Referring now to FIG. 4, generally designated at 80 is a partial longitudinal section of the load end of the presently preferred embodiment of the cross-flow diffusion furnace according to the present invention. The one or more injectors 56 rest on the bottom wall of the liner 66, and the liner 66 rests on the tube 12. The seal 16 includes a first annular clamp 82 for the tube 12 which is in vacuum-tight sealing relation therewith via a gasket 84, and a second annular clamp 86, longitudinally outside the clamp 82, for the cross-flow liner 66 which is in vacuum-tight sealing relation therewith via a gasket 88.

Figure 5A:
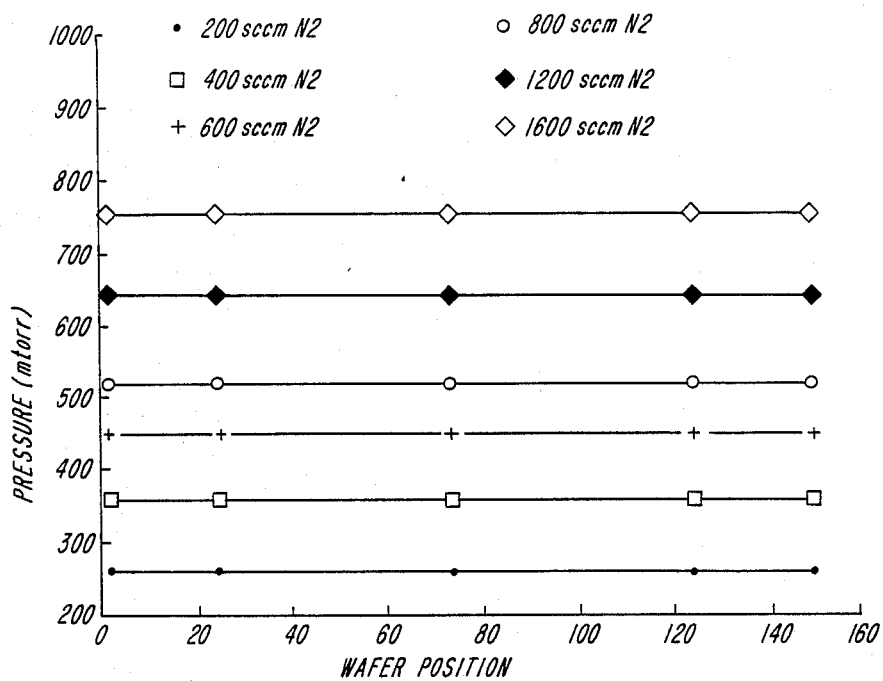
FIG. 5 illustrates datagraphs in FIGS. 5A and 5B thereof that show the performance of the presently preferred embodiment of the novel cross-flow diffusion furnace of the present invention.
Figure 5B:
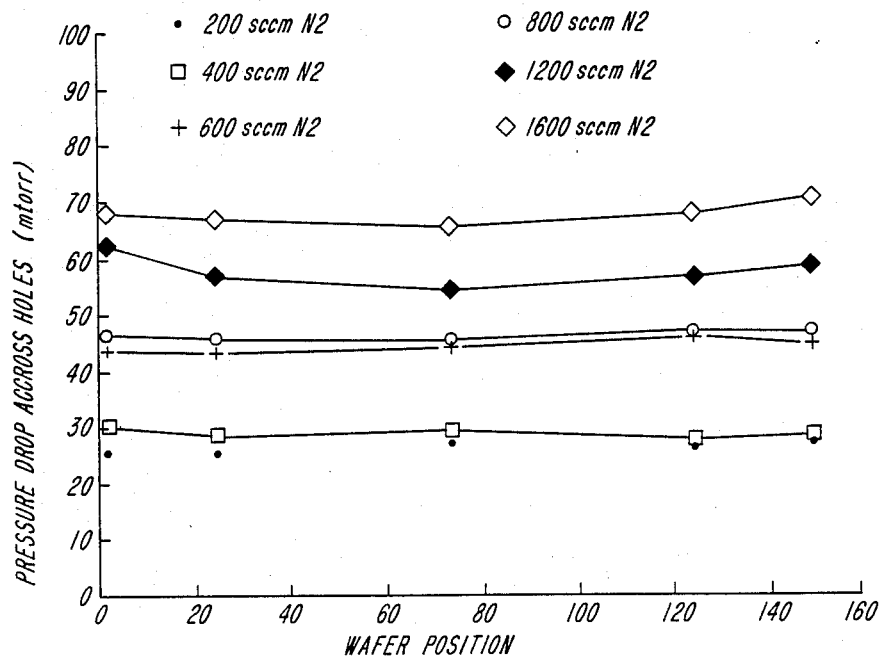

In operation, the vacuum system produces a first vacuum pressure in the reaction chamber 14 of the diffusion furnace. The first vacuum pressure acts in the direction of elongation of the diffusion tube. The cross-flow liner 64 is operative in response to the first vacuum to create a second vacuum pressure inside the cross-flow liner that acts in a direction transverse the direction of elongation of the reaction vessel and across the surface of the wafers. The spacing and patterning of the cross-flow liner openings cooperates with the spacing and pattern of the one or more gas injector openings to provide such a second vacuum pressure that no pressure drop or substantially no pressure drop acts in the direction of elongation of the cross-flow liner and along the operative locale of the reaction chamber, as shown in FIG. 5A, while giving a substantially uniform change in pressure in a direction transverse thereto along the operative locale of the reaction chamber, as shown in FIG. 5B. The gas released through the openings of the one or more injectors flows across the wafers and through the confronting openings of the cross-flow liner creating a uniform and controlled gas flow pattern all along the operative locale of the reaction chamber. The dimensions and spacings of the presently preferred embodiment for the datagraphs illustrated in FIGS. 5A and 5B include 180 liner holes of 0.095 inch diameter on 0.6 inch centers arranged in three rows of 60 holes each that are spaced over 30° of arc, and 5 injector holes of 0.035 inch diameter on 6 inch centers.

The cross-flow liner 64 is easily retrofittable on existing diffusion furnaces of the type manufactured by the instant assignee.

Many modifications of the presently disclosed invention will become apparent to those skilled in the art without departing from the inventive concept.

What is claimed is:

1. A cross-flow diffusion furnace for processing semiconductor wafers, comprising;
   a cylindrical diffusion tube defining a cylindrical reaction chamber
   an apertured cylindrical cross-flow liner disposed within said cylindrical diffusion tube and having one end open and one end closed and having an operative locale across which CVD takes place;
   a boat loader extending through said cross-flow liner open end into said cross-flow liner;
   means for removably fastening said boat loader in air tight sealing engagement to one end of said cylindrical diffusion tube;
   means coupled to said cylindrical diffusion tube for controllably heating said reaction chamber;
   a vacuum source;
   means for connecting said vacuum source to the other end of said cylindrical diffusion tube, the vacuum source producing a greater negative pressure interior to said cylindrical diffusion tube and exterior to said cross-flow liner than within said cross-flow liner; and
   means for injecting gas locally and axially along the operative locale of said cross-flow liner.

2. The invention of claim 1, wherein said boat loader includes a cantilevered paddle, and said injecting means includes at least one gas injection tube.

3. The invention of claim 2, wherein said paddle and said at least one gas injection tube are received through said open end of said apertured cylindrical cross-flow liner.

4. The invention of claim 3, wherein said cross-flow liner and said at least one gas injection tube have apertures sized and patterned to provide said second negative pressure in response to said first negative pressure.

5. The invention of claim 4, wherein said cylindrical diffusion tube has an inside diametrical dimension, and wherein said apertured cross-flow liner has an outside diametrical dimension selected to be less than the inside dimension of the cylindrical diffusion tube by an amount to provide a ten to a fifty millimeter annulus.

6. The invention of claim 5, wherein said paddle is apertured to allow injectant gas to flow thereinthrough.

7. The invention of claim 3, further including a thermocouple sheath in vacuum-tight sealing engagement with said closed end.

* * * * *